United States Patent [19]

de Cremoux et al.

[11] 4,366,334
[45] Dec. 28, 1982

[54] PHOTOVOLTAIC CELL USABLE AS A SOLAR CELL

[75] Inventors: Baudouin de Cremoux; Pierre Poulain; Nicole Sol, all of Paris, France

[73] Assignee: Thomson-CSF, Paris, France

[21] Appl. No.: 229,524

[22] Filed: Jan. 29, 1981

[30] Foreign Application Priority Data

Feb. 1, 1980 [FR] France .................. 80 02249

[51] Int. Cl.³ .......................................... H01L 31/06
[52] U.S. Cl. .................................. 136/255; 136/252; 136/258; 136/262; 357/15; 357/30
[58] Field of Search ................. 136/255, 252, 258 PC, 136/262; 357/15, 30

[56] References Cited

U.S. PATENT DOCUMENTS 3,990,101 11/1976 Ettenberg et al. ................. 136/255
4,278,830 7/1981 Stirn et al. .......................... 136/255

OTHER PUBLICATIONS

H. J. Hovel et al., "Minority Carrier Confinement Thin Film Solar Cell", *IBM Tech. Disc. Bull.*, vol. 18, pp. 544-545 (1975).

J. M. Woodall et al., "Outlooks for GaAs Terrestrial Photovoltaics", *J. Vac. Sci-Technol.*, vol. 12, pp. 1000-1003 (1975).

*Primary Examiner*—Aaron Weisstuch
*Attorney, Agent, or Firm*—Oblon, Fisher, Spivak, McClelland & Maier

[57] ABSTRACT

The invention relates to a low cost photovoltaic cell, using a minimum thickness layer of semiconductor compounds able to provide the photovoltaic effect and specifically in polycrystalline form. On a molybdenum sheet an auxiliary polycrystalline germanium layer is deposited in order to facilitate subsequent depositions. This is followed by an intermediate polycrystalline layer of gallium aluminum arsenide and an active layer of polycrystalline gallium arsenide. The presence of the intermediate layer with a wider forbidden band than that of the active layer compensates the effect on the efficiency of the limited thickness of the active layer.

13 Claims, 4 Drawing Figures

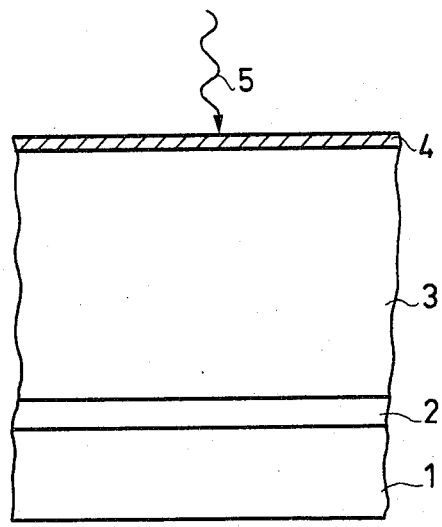
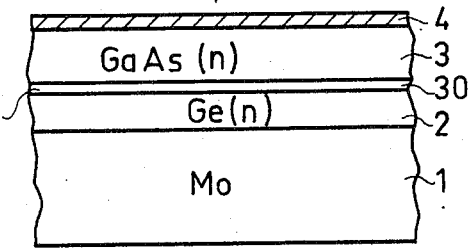
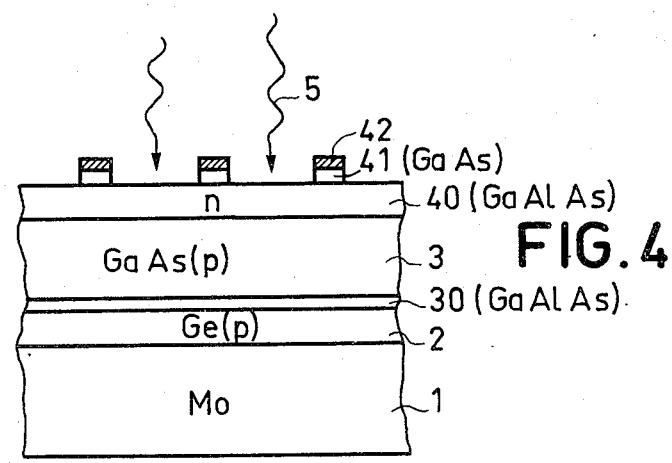

PHOTOVOLTAIC CELL USABLE AS A SOLAR CELL

BACKGROUND OF THE INVENTION

The present invention relates to a photovoltaic cell, which can be used in the manufacture of solar cells.

In the field of solar cells the aim is to produce equipment having a low cost, but an acceptable conversion efficiency. In practice a compromise is made between these partly contradictory requirements.

Relatively high conversion efficiencies of approximately 20% can be obtained by using as the active layer a monocrystalline material formed by a semiconductor of the III-V type, such as GaAs or InP. However, this leads to high costs and is more suitable for solar generators using optical solar flux concentration means then for standard uses.

More recently it has been proposed to reduce the cost by using thin polycrystalline layers deposited on inexpensive graphite or molybdenum supports.

Thus, a solution has been described in which a layer of polycrystalline germanium is placed between the support and the active polycrystalline gallium arsenide layer, which has the effect of increasing the size of the particles of the polycrystalline active layer deposited by epitaxy on the germanium. Conversion efficiencies of approximately 5 to 6% are obtained with such a composite support (germanium-coated molybdenum). Germanium could be replaced by another material with a lattice parameter relatively close to that of the material of the active layer in order to permit epitaxy.

The object of the invention is either to permit an improvement in the efficiency, accompanied by the same costs for the starting material and other components, or a reduction in the price of the cell, particularly by reducing the starting material costs, whilst maintaining an identical efficiency.

BRIEF SUMMARY OF THE INVENTION

The photovoltaic cell according to the invention is of the type incorporating an ohmic back contact, a very thin active semiconductor layer, whose thickness is approximately the diffusion length of the material which absorbs the light radiation and a metallic or semiconductor layer forming a rectifying junction with the active layer in such a way that the assembly has a photovoltaic effect.

It is more particularly characterized in that it also comprises between the active layer an the ohmic back contact an intermediate layer which is much thinner than the active layer and which is formed by a semiconductor component with a forbidden band width larger than that of the active layer, the crystalline parameters of the materials of the intermediate layer and of the active layer differing by 5 parts per 1000 or less.

BRIEF DESCRIPTION OF THE DRAWINGS

The invention is described in greater detail hereinafter relative to non-limitative embodiments and the attached drawings, wherein:

FIG. 1 shows an example of a prior art photovoltaic cell.

FIGS. 3 and 4 are diagrammatic sectional views through two embodiments of the invention.

DETAILED DESCRIPTION OF THE PREFERRED EMBODIMENTS

Figure 2:
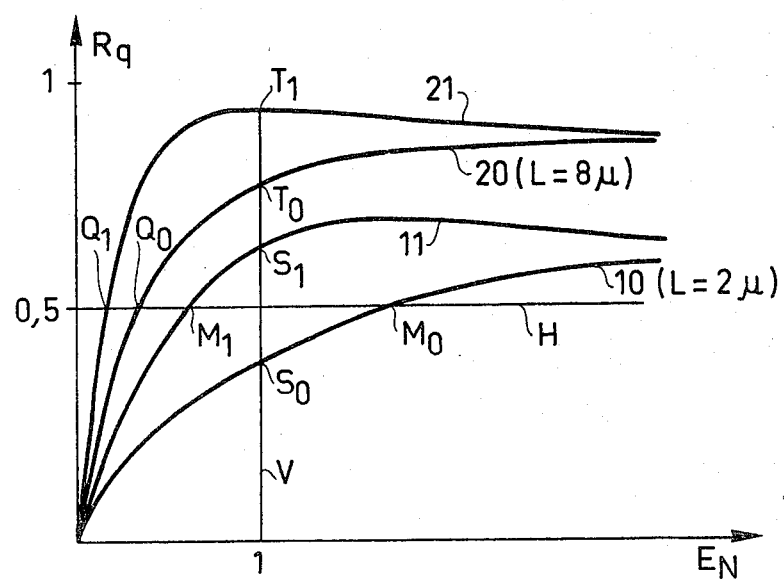
FIG. 2 is an explanatory graph.

Efficiency considerations are involved in the present invention. However, a clear distinction must be made between conversion efficiency and quantum efficiency. The former is the overall energy efficiency as referred to hereinbefore. The quantum efficiency, which is only partly involved in the total energy efficiency, is defined by the ratio between the number of charge carriers, collected by the electrodes of the photovoltaic cell and the number of photons absorbed by the semiconductor material, each of them giving rise to an electron-hole pair. It is known that among the factors reducing the quantum efficiency it is mainly necessary to measure the life time of the minority charge carriers (electrons or holes depending on whether the semiconductor material is of the p or n type) before they are collected by the electrode in question to combine in the production of electrical current.

(1) In the case of an active layer of type n mateiral, the majority carrier electrons created by the photovoltaic effect all participate in the production of current. However, the minority carrier holes partly disappear for a number of reasons:

a- their life is limited and there is an average diffusion length for these carriers which, for a material of given composition and crystalline quality, is a function of the speed of the carrier (mobility) in the medium in question and of the probability of its recombination in this medium.

b- There is an absorption of the holes by the ohmic contact, no matter whether the latter is formed by a metal or a semiconductor layer.

(2) In the case of an active layer of a p-type material, the phenomena are the same, but the holes and electrons are reversed. As a result, the mobility of the electrons is higher than that of the holes, giving a diffusion length which is approximately four times greater, everything else being equal, and significantly improves the quantum efficiency.

For a given thickness of the active layer, it has been calculated that the quantum efficiency value is mainly a function of the diffusion length. The results of these relatively complex calculations are illustrated hereinafter by curves 10 and 20 of FIG. 2 relating to a known photovoltaic cell shown in FIG. 1, but which are otherwise of a very general nature. FIG. 2 also has curves 11 and 21 relating to the invention.

FIG. 1 shows in partial diagrammatic section a gallium arsenide photovoltaic cell on a composite molybdenum-germanium support. On molybdenum sheet 1 serving as an electrode and mechanical support for the cell assembly has been deposited by a known method a type n polycrystalline germanium layer 2 having a thickness of a few microns.

A much thicker polycrystalline gallium arsenide layer 3 (active layer) has been deposited by epitaxy on layer 2.

Finally a metal layer 4, e.g. of gold, has been deposited by vacuum evaporation on layer 3. It is sufficiently thin to be transparent to solar radiation and serves as a complementary electrode for electrode 1.

In FIG. 2 the abscissa shows the thickness $E_N$ or standardized thickness of the active layer, defined as $E_N = E/L$ in which E is the active layer thickness and L the diffusion length expressed in the same unit. The quantum efficiency $R_q$ is shown on the ordinate.

Curves 10 and 20 are plotted relative to two values of L, namely 2 and 8 microns respectively, for a conventional cell. The curves are clearly separate, although E/L is shown on the abscissa as a function of L, due to the non-linearity of $R_q$. Curves 11 and 12 respectively relate to the same values of L for cells according to an embodiment of the invention, e.g. that of FIG. 3.

It is possible to see that:

(a) with $R_q$ equal, the straight line H intersects the curves at $M_0$, $M_1$, $Q_0$, $Q_1$, showing that in the case of the invention (curves 11 and 21) the thicknesses are smaller than in the case of known embodiments (curves 10 and 20);

(b) for a standardized equal thickness, the straight line V intersects the curves at $S_0$, $S_1$, $T_0$ and $T_1$, demonstrating that $R_q$ is larger in the case of the invention.

It can be seen that it is possible to double the efficiency in the case of the invention with a very small thickness of the active layer ($E_N$ approximately equal to one).

According to a first embodiment of the invention shown in FIG. 3, there is the same composite support for the photovoltaic cell as in FIG. 1, i.e.) a molybdenum sheet 1 covered with a type n polycrystalline germanium layer 2. This layer can be obtained by using one of the three following methods:

(a) CVD deposition from the vapour phase in an "epitaxy apparatus-type reactor" by decomposing a volatile compound such as germanium tetrachloride;

(b) cathodic sputtering of the germanium;

(c) vacuum evaporation of germanium with condensation on the support.

In FIG. 3 by successive epitaxy processes a $Ga_{1-x}Al_xAs$ polycrystalline layer 30 with $0.3 \leq x \leq 0.5$ and a polycrystalline GaAs layer 3 have been deposited.

It is known that the matching of crystalline lattices of monocrystals of GaAs and $Ga_{1-x}Al_xAs$ is obtained to within 1 part in 2000, no matter what the value of x, which is favorable to obtaining a satisfactory efficiency of the cell.

Layer 30 is of type n and is doped so as to have a dopant concentration above $10^{17}$ cm$^{-3}$, its thickness being approximatley 0.1 micron. Layer 3 is also of type n, but with a dopant concentration between $10^{16}$ and $10^{17}$ cm$^{-3}$, its thickness being between 1 and 2 microns.

These two layers are preferably deposited by using the now standard method of decomposing organometallic gallium and aluminium compounds in an epitaxy apparatus where different layers of different compositions are deposited by varying the composition of the gases introduced into the apparatus, without removing the sample to be treated.

As in the case of FIG. 1, an electrode formed by an approximately 100 Angströms thick gold layer is deposited by a conventional vacuum metallization method. It is known that under these conditions a Schottky diode is obtained on GaAs.

According to a second embodiment of the invention shown in FIG. 4, there is once again a composite support like that in the first embodiment, but with a germanium layer 2 doped p-type. The intermediate $Ga_{1-x}Al_xAs$ layer 30 is of the same thickness, but has p type doping with a dopant concentration exceeding $10^{17}$ cm$^{-3}$. The value of x is the same as that in the first embodiment.

The GaAs layer 3 is of p type with a dopant concentration between $10^{17}$ and $10^{18}$ cm$^{-3}$, with a thickness between 1 and 4 microns.

A layer 40 of thickness between 0.1 and 1 micron is deposited by a supplementary epitaxy operation in the same apparatus, so as to obtain a polycrystalline deposit of $Ga_{1-y}Al_yAs$ with $0.5 \leq y < 1$, the doping being of the n-type and continued until the concentration of dopant is at a minimum of $10^{18}$ cm$^{-3}$.

Parameter y of layer 40 can be varied so as to have an increasingly wide forbidden band width, i.e. increasingly progressively, e.g. from 0.2 to 0.8 during the epitaxy of layer 40. Layer 40 forms an n-p junction with layer 3 which is indispensable to the constitution of the cell.

In this embodiment the gold layer cannot be directly deposited on layer 40, due to the poor ohmic contact which would result therefrom and a true ohmic contact is desired.

A GaAs layer 41 is deposited, which is then patterned in grid form in the manner shown in FIG. 4, to prevent the absorption of part of the indicent photons by the GaAs. This grid is obtained in conventional manner by chemical etching after prior masking. Finally, a metal layer 42 is deposited on grid 41 by using, in conventional manner, a mask identical to that previously used.

To explain the theoretical operation of the photovoltaic cells according to the invention a number of complicated calculations are required. In the case of diffusion lengths of 2 and 8 microns, substantially corresponding to the case of holes and electrons in polycrystalline materials of relatively good equivalent quantities, e.g. for large-grained polycrystalline materials, the calculations lead to curves close to curves 11 and 21 of FIG. 2. As has been shown hereinbefore, these curves show the advantages of the invention compared with the prior art solutions.

If it was desired to give a qualitative explanation to the phenomenon in the case of the intermediate layer which forms the main characteristic of the invention, it would be said that the presence of layer 30 (FIGS. 3 or 4) introduces into the plot of the forbidden band limits a bulge which has a function similar to that of a potential hill of preventing minority carriers from falling into a potential well located on the side of the cell support and of being lost for the purpose of producing the electrical current.

Other semiconductor materials can be used with the scope of the invention. Thus, in the case of GaAs another ternary material of a quaternary material such as GaInAsP can be used. In the case of InP a quaternary compound having variable proportions of InP can be used, and another alloy e.g. CdS.

What is claimed is:

1. A photovoltaic cell of the type comprising an ohmic bottom contact comprising a metal layer coated with a semiconductor layer, an active semiconductor layer whose thickness is approximately the same as the diffusion length of the semiconductor material, a semiconductor or metallic layer forming a rectifying junction with the active layer in such a way that the assembly can have a photovoltaic effect, further comprising between the active semiconductor layer and the ohmic bottom contact an intermediate layer which is much thinner than the active semiconductor layer and which is formed from a semiconductor compound with a forbidden band width greater than that of the active layer, the crystalline parameters of the materials of the intermediate layer and the active layer differing by 5 parts per 1000 or less.

2. A photovoltaic cell according to claim 1, wherein the active layer comprises polycrystalline gallium arsenide and the intermediate layer is made from polycrystalline $Ga_{1-x}Al_xAs$ with $0.3 \leq x \leq 0.5$.

3. A photovoltaic cell according to claim 1, wherein said ohmic bottom contact comprises a metal sheet covered with a polycrystalline germanium layer contiguous with the intermediate layer, the thickness of said intermediate layer being approximately 0.1 micron.

4. A photovoltaic cell according to claim 3, wherein the germanium layer, the active semiconductor layer and the intermediate layer have n type conductivity, the active layer being covered with a highly conducting metal layer of thickness so as to be transparent to light and forming a Schottky contact with the active semiconductor layer.

5. A photovoltaic cell according to claim 3, wherein the germanium layer, the active semiconductor layer and the intermediate layer have p type conductivity and wherein an n type semiconductor layer with a wider forbidden band than that of the active layer is deposited on the latter.

6. A photovoltaic cell according to claim 4, wherein the concentration of n type dopant in the gallium arsenide active layer is approximately $10^{16}$ to $10^{17}$ cm$^{-3}$ and the concentration of n type dopant in the intermediate layer exceeds $10^{17}$ cm$^{-3}$.

7. A photovoltaic cell according to claim 5, wherein the active semiconductor layer is gallium arsenide, the intermediate layer is $Ga_{1-x}Al_xAs$ with $0.3 \leq x \leq 0.5$ and the n type layer is $Ga_{1-y}Al_yAs$ with $0.5 \leq y < 1$.

8. A photovoltaic cell according to claim 7, wherein the concentration of the n type dopant in the active semiconductor layer is $10^{16}$ to $10^{17}$ cm$^{-3}$ and wherein the concentration of the p type dopant in the intermediate layer exceeds $10^{17}$ and wherein the concentration of the n type dopant in the n type layer exceeds $10^{18}$ cm$^{-3}$.

9. A photovoltaic cell according to claim 7, wherein the n type layer is covered by a GaAs layer which is itself covered by a metal layer, the assembly of said two layers being patterned in such a way as to permit the passage of light therethrough.

10. A photovoltaic cell according to claim 7, wherein the parameter y varies progressively through the thickness of the n type layer.

11. A photovoltaic cell according to claim 1, wherein the active semiconductor layer is of n type GaAs, and the intermediate layer comprises a compound of Ga, In, As and P.

12. A photovoltaic cell according to claim 1, wherein the active semiconductor layer is of p type GaAs, and the n type layer and the intermediate layer comprises compounds of Ga, In, As and P.

13. A photovoltaic cell according to claim 1, wherein the active semiconductor layer is InP, and the intermediate layer comprises a compound of In, P, Cd and S.

* * * * *